(12) United States Patent
Lallier et al.

(10) Patent No.: US 7,595,289 B2
(45) Date of Patent: Sep. 29, 2009

(54) COMPOSITIONS BASED ON FLUORINATED HYDROCARBONS AND SECONDARY BUTANOL FOR DEFLUXING ELECTRONIC BOARDS

(75) Inventors: Jean-Pierre Lallier, Saint Bonnet de Mure (FR); Emmanuel Rastelletti, Venissieux (FR)

(73) Assignee: Arkema France, Colombes (FR)

( * ) Notice: Subject to any disclaimer, the term of this patent is extended or adjusted under 35 U.S.C. 154(b) by 87 days.

(21) Appl. No.: 10/569,310

(22) PCT Filed: Jul. 2, 2004

(86) PCT No.: PCT/EP2004/007302

§ 371 (c)(1),
(2), (4) Date: Feb. 22, 2006

(87) PCT Pub. No.: WO2005/026310

PCT Pub. Date: Mar. 24, 2005

(65) Prior Publication Data

US 2006/0217277 A1    Sep. 28, 2006

(30) Foreign Application Priority Data

Sep. 16, 2003    (FR)    ................... 03 10833

(51) Int. Cl.
*C11D 7/50*    (2006.01)
(52) U.S. Cl. .................. 510/175; 510/407; 510/411; 510/412; 134/40
(58) Field of Classification Search ................ 510/175, 510/407, 411, 412; 134/40
See application file for complete search history.

(56) References Cited

U.S. PATENT DOCUMENTS

| 5,478,492 A | 12/1995 | Barthelemy et al. |
| 5,552,080 A | 9/1996 | Bolmer et al. |
| 5,686,567 A * | 11/1997 | Kiyohara et al. ............. 528/310 |
| 5,989,456 A * | 11/1999 | Tsuzaki ...................... 252/364 |
| 6,008,179 A | 12/1999 | Flynn et al. |
| 6,312,759 B1 * | 11/2001 | Yamada et al. .............. 427/131 |
| 6,403,846 B1 * | 6/2002 | Sekiya et al. ................ 570/134 |
| 6,552,090 B1 * | 4/2003 | Behr et al. ..................... 516/25 |
| 7,053,035 B2 * | 5/2006 | Hanada et al. .............. 510/407 |
| 2006/0052268 A1 * | 3/2006 | Artuphel et al. ............. 510/411 |

FOREIGN PATENT DOCUMENTS

| FR | 2 766 837 | 2/1999 |
| JP | 2003 226897 | 8/2003 |
| JP | 2003 238992 | 8/2003 |

* cited by examiner

*Primary Examiner*—Gregory E Webb
(74) *Attorney, Agent, or Firm*—Steven D. Boyd

(57) ABSTRACT

The present invention concerns the field of fluorinated hydrocarbons and relates to novel compositions containing fluorinated hydrocarbons, secondary butanol and optionally DMSO. These novel compositions are particularly advantageous for defluxing electronic boards in particular for defluxing electronic boards containing "no clean" solder fluxes.

9 Claims, 1 Drawing Sheet

COMPOSITIONS BASED ON FLUORINATED HYDROCARBONS AND SECONDARY BUTANOL FOR DEFLUXING ELECTRONIC BOARDS

FIELD OF THE INVENTION

The present invention concerns the field of fluorinated hydrocarbons, and more particularly relates to novel compositions containing fluorinated hydrocarbons and secondary butanol, which can be used for defluxing electronic boards, notably for defluxing electronic boards containing "no clean" solder fluxes.

BACKGROUND OF THE INVENTION

During the manufacturing of electronic boards, an operation consisting of cleaning the residues of the substances used to improve the solder quality (referred to as solder fluxes) is necessary in order to remove the soldering flux which adheres to the printed circuits. This removal operation is referred to, in the field, as defluxing. Fluorinated hydrocarbons, and more particularly 1,1-dichloro-1-fluoroethane (known under the name HCFC 141b), are widely used in this field. An azeotropic formulation based on HCFC 141b and methanol (known in the field under the name FORANE® 141b MGX) is particularly suitable for use under hot conditions in a defluxing machine.

However, due to its action on the ozone layer, which is not zero (ozone degradation potential ODP=0.11), HCFC 141b is subject to considerable regulations which are increasingly aimed at eliminating it. Thus, the European regulation regarding substances harmful to the ozone layer (no. 2037/2000) has prohibited the use of HCFCs (hydrochloroflurocarbons) such as HCFC 141b in solvent applications since 1 Jan. 2002, except for the fields of aeronautics and aerospace, where the ban takes effect from 2009 on European territory.

Substitution solutions aimed at replacing HCFC 141b in the defluxing applications have been proposed, in particular the use of HFC (hydrofluorocarbons) and/or of HFE (hydrofluoro ethers). HFCs and HFEs have no action on the ozone layer (ODP zero or negligible with respect to the regulations in force).

Among the most well-known and most commonly used HFCs, mention may be made, for example, of 1,1,1,3,3-pentafluorobutane (365 mfc), 1,1,1,2,3,4,4,5,5,5-decafluoropentane (4310 mee), 1,1,1,2-tetrafluoroethane (134 a), pentafluoroethane (125), 1,1,1-trifluoroethane (143 a), difluoromethane (32), 1,1-difluoroethane (152 a), 1-fluoroethane (161), 1,1,1,2,3,3,3-heptafluoropropane (227 ea), 1,1,1,3,3,pentafluoropropane (245 fa), octafluoropropane (218), (perfluorobutyl)ethylene ($C_4H_9CH=CH_2$), 1,1,2,2,3,4,5-heptafluorocyclopentane ($C_5H_3F_7$), perfluorohexylethylene ($C_6F_{13}CHCH_2$), tridecafluorohexane ($C_6F_{13}H$) and perfluoro(methylmorpholine) (PF 5052) and also their mixtures which may contribute to improving certain properties, such as non-flammability, for example.

Among the most well-known and most commonly used HFEs, mention may be made, for example, of methylheptafluoropropyl ether ($C_3F_7OCH_3$), methylnonafluorobutyl ether ($C_4F_9OCH_3$), ethylnonafluorobutyl ether ($C_4F_9OC_2H_5$) and perfluoropyran ($C_5F_{10}O$), and also their mixtures.

HFCs and HFEs exhibit physicochemical properties comparable to those of HCFC 141b: good thermal and chemical stability, low toxicity, low boiling point, low surface tension. However, they have proven to be ineffective in certain defluxing applications, in particular for the defluxing of electronic boards containing solder fluxes which are not normally intended to be cleaned. These fluxes are very difficult to remove and, in the field, are called "no clean" fluxes. These fluxes come from non-wash solder creams used for surfaces difficult to solder. These creams are based on complex mixtures of organic and inorganic compounds. Among these compounds, mention may be made of metal powders with a small particle size, based on tin, silver, lead, etc., binders such as, for example, rosin, solvents, surfactant resins, thixotropic agents or halogenated activators.

DETAILED DESCRIPTION OF THE INVENTION

Figure 1:
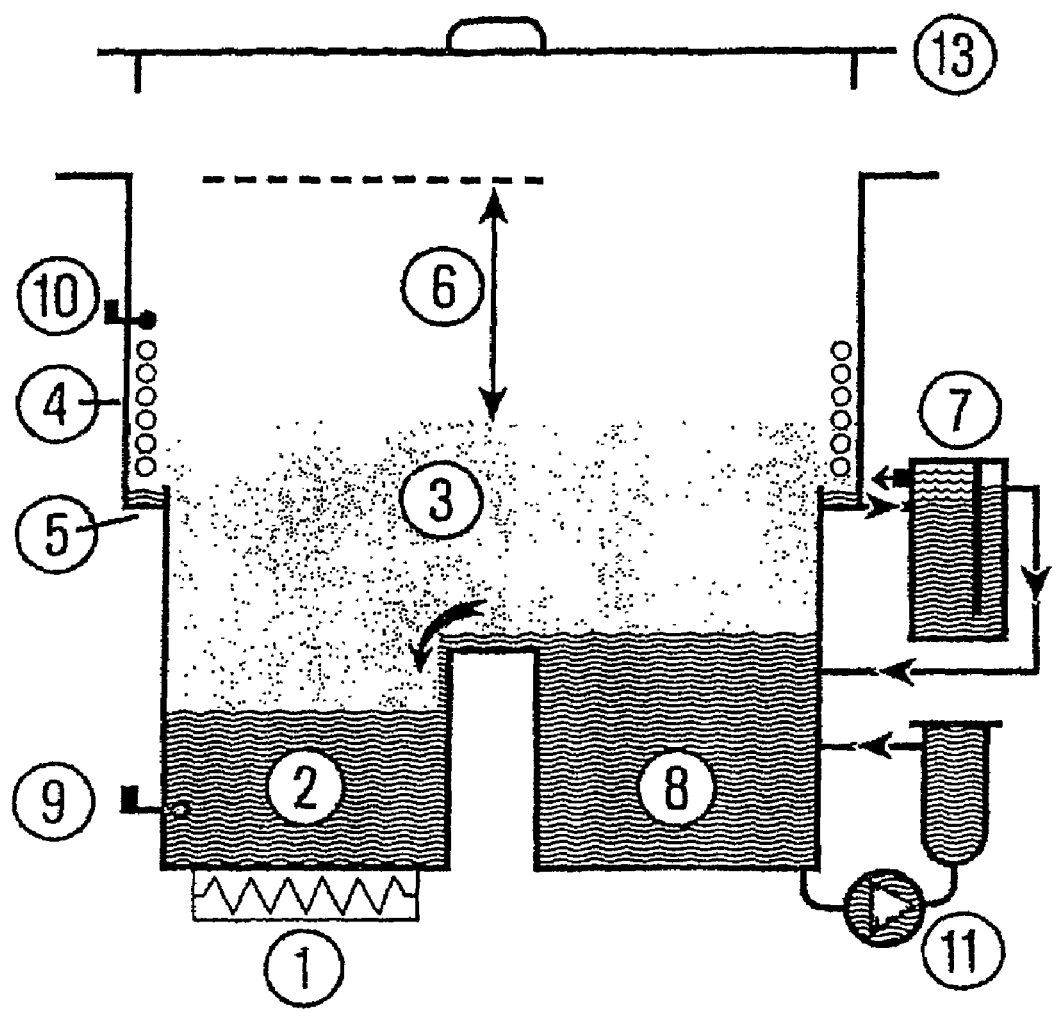
FIG. 1 is a schematic of a cleaning system suitable for use with the present invention.

Unexpectedly, it has been found that "no clean" solder fluxes can be easily removed using compositions comprising fluorinated hydrocarbons and secondary butanol, the action of which can be reinforced by the presence of dimethyl sulphoxide (which will subsequently be referred to as DMSO).

A subject of the present invention is therefore compositions comprising a fluorinated base, secondary butanol and optionally DMSO, these novel compositions being particularly suitable for the defluxing of electronic boards containing "no clean" solder fluxes. These novel compositions may also be suitable for removing other solder fluxes.

The expression "fluorinated base which can be used in the compositions according to the invention" is intended to mean a mixture of one or more fluorinated compounds having a surface tension of less than 30 mN/m at 25° C. (measured according to the ISO 304 standard) and a negligible action on the ozone layer (zero or negligible ODP). The fluorinated compound(s) can be chosen from hydrofluorocarbons (HFCs) and/or hydrofluoro ethers (HFEs).

The compositions according to the invention comprise from 1 to 40% by weight of fluorinated base, from 50 to 99% by weight of secondary butanol and from 0 to 30% by weight of DMSO, the sum of the percentages by weight of the constituents being equal to 100. Preferably, they comprise from 15 to 25% by weight of fluorinated base, from 50 to 70% by weight of secondary butanol and from 15 to 25% by weight of DMSO.

As nonlimiting examples of HFCs, mention may be made of 1,1,1,3,3-pentafluorobutane (365 mfc), 1,1,1,2,3,4,4,5,5,5-decafluoropentane (4310 mee), 1,1,1,2-tetrafluoroethane (134 a), pentafluoroethane (125), 1,1,1-trifluoroethane (143 a), difluoromethane (32), 1,1-difluoroethane (152 a), 1-fluoroethane (161), 1,1,1,2,3,3,3-heptafluoropropane (227 ea), 1,1,1,3,3,pentafluoropropane (245 fa), octafluoropropane (218), (perfluorobutyl)ethylene ($C_4H_9CH=CH_2$), 1,1,2,2,3,4,5-heptafluorocyclopentane ($C_5H_3F_7$), perfluorohexylethylene ($C_6F_{13}CHCH_2$), tridecafluorohexane ($C_6F_{13}H$) and perfluoro(methylmorpholine) (PF 5052).

As nonlimiting examples of HFEs, mention may be made of methylheptafluoropropyl ether ($C_3F_7OCH_3$), methylnonafluorobutyl ether ($C_4F_9OCH_3$), ethylnonafluorobutyl ether ($C_4F_9OCH_2H_5$) and perfluoropyran ($C_5F_{10}O$).

Most of these compounds are commercially available.

Among the fluorinated bases which can be used in the compositions according to the invention, mention may be made, for example, of HFC 4310 mee or of the binary or ternary mixtures HFC 365 mfc/HFC 4310 mee, HFC 365 mfc/HFC 4310 mee/HFC 227 ea and HFC 227 ea/HFE.

Preferably, mixtures of HFC 365 mfc and HFC 4310 mee are used as fluorinated base. Advantageously, these mixtures comprise from 1 to 99% of HFC 365 mfc and from 1 to 99% of HC 4310 mee. A preferred mixture consists of 4% of HFC 365 mfc and 96% of HFC 4310 mee. These mixtures can optionally contain HFC 227 ea.

The fluorinated base can also contain trans-1,2-dichloroethylene, the boiling point of which is 47.8° C.

The compositions according to the invention can be easily prepared by simply mixing the constituents.

The compositions according to the invention exhibit defluxing performance levels which are at least equivalent to those of the azeotropic composition FORANE® 141b MGX based on HCFC 141b and methanol, widely used in this application. They have the advantage of being relatively economical compared to HFC or HFE derivatives used alone. The compositions according to the invention are non-inflammable, they do not have a flashpoint, they exhibit a low level of toxicity and they are devoid of any destructive effect with respect to the ozone layer.

A machine and a scheme for functioning, illustrating a known embodiment for the defluxing, represented in the single FIGURE, are described below.

The machine comprises two tanks, a cleaning tank (2) and a rinsing tank (8), and a cover (13). The tanks (2) and (8) are preferably tall and narrow so as to correctly trap the solvent vapours. They can be equipped with ultrasound systems.

At the outset, the cleaning tank (2) containing a defluxing composition according to the invention is brought to the apparent boiling point of the fluorinated base present in the composition, using the heating resistance (1). The maximum apparent boiling point of 70° C. makes it possible to protect the components to be cleaned. Since the boiling point of the DMSO (189° C.) and of the secondary butanol (99.5° C.) are clearly higher than the boiling point of the fluorinated base (generally less than 55° C.), the mixture of these solvents remains in the liquid phase of the cleaning bath (2), without undergoing any notable evaporation.

The rinsing tank (8) is filled with fluorinated base alone.

The vapours (3) of fluorinated base derived from boiling the tank (2) are recycled in the rinsing tank (8) via a cooling coil 4 and recovery in a channel (5). The temperature probes (9) and (10) make it possible to control the temperatures of the liquid and vapour phases. The role of the separator (7), comprising a molecular sieve, of type 3A, for example, is to separate from the solvent the water originating from the condensation of the steam from the atmosphere. The cleaning tank (2) is fed with relatively clean recycled fluorinated base via an overflow system from tank (8), the percentage soiling being a maximum of 10% compared to the cleaning tank. The pump (11) allows filtration of the solvent in order to retain in particular the solid particles. In a manner similar to the use of HCFC 141b, the cleaning bath may be changed when the latter contains approximately 30% soiling.

The use of this machine consists in initially immersing the electronic board to be cleaned in the cleaning tank (2). Areas covered in "no clean" solder flux are found on the surface to be treated.

The cleaned component is then immersed in the rinsing bath (8). Through an effect of entrainment over the surface of the components, the rinsing bath (8) consisting of pure fluorinated base may gradually become polluted with the solder fluxes. A second rinsing bath can be used in the event of considerable entrainment. Further rinsing in the region (3) comprising the fluorinated base in the vapour phase can also be carried out before drying in the cold region (6) of the machine.

Another subject of the invention is therefore a method for defluxing electronic boards comprising a first cleaning step and a second rinsing step, characterized in that the cleaning step is carried out with a composition according to the invention in a cleaning tank (2) and the rinsing step is carried out with a pure fluorinated base in a rinsing tank (8), this fluorinated base possibly being different from that present in the cleaning tank (2).

According to a preferred variant of the method according to the invention, the fluorinated base present in the rinsing tank is identical to that present in the cleaning tank. This method of carrying out the procedure makes it possible to obtain clean dry components free of solder flux and free of traces of solvent. In cases where cleaning is difficult, it will be preferable to use a cleaning composition comprising a high content of secondary butanol optionally with DMSO, at least 70%. If the rinsing bath(s) contain(s) a fluorinated base other than that present in the cleaning bath, this would not depart from the field of the invention.

The compositions of the invention are also inert with respect to most surfaces to be treated, whether they are made of metal, plastic or glass. They can therefore be used in the same applications as those of HCFC 141b. In particular, they can be used as an agent for cleaning or for degreasing solid surfaces or as a drying agent for removing water at the surface of solid objects, for the dry cleaning of textiles, for the cleaning of refrigeration plants, as agents for expanding polyurethane foams, or as aerosol propellants, heat-transfer fluids or silicone-depositing agents.

The examples below are given purely by way of illustration of the invention and should in no way be interpreted as a limitation thereof. The percentages used in the examples to indicate the content of the compositions are percentages by weight.

EXAMPLE 1

To evaluate the defluxing efficiency small stainless steel plates with a surface area of 8 $cm^2$ are used. Each small plate is degreased beforehand with FORANE® 141b degreasing grade (141b DGX), and then weighed.

Approximately 2 g of solder cream of the type F380 Ag3.5-90.OL25 from the company HERAEUS are deposited on each small plate.

Each small plate, introduced into a glass crystallizer, is heated on a hotplate at 250° C. for approximately 1 to 2 minutes. During heating, the metal contained in the solder cream forms a ball which slides over the small plate, thus separated from the flux which remains on the small plate. The small plate containing the solder flux is dried at ambient temperature for approximately 16 hours, and then weighed.

Each small plate is then immersed for 30 minutes at ambient temperature of between 20 and 25° C. in a beaker containing 60 ml of test composition.

Next, the small plate is removed from the beaker, rinsed with a solvent of FORANE® 365 HX type consisting of a mixture of HFC 365 mfc and HFC 4310 mee, and then weighed. The amount of solder flux removed is thus obtained by the difference.

With the composition consisting of 20% of fluorinated base (19.2% of HFC 4310 mee and 0.8% of HFC 365 mfc), 60% of secondary butanol and 20% of DMSO, 93% of the flux is removed.

EXAMPLE 2

The same procedure as that described in Example 1 is used. The composition based on 25% of HFC 4310 mee and 75% of secondary butanol made it possible to remove 86% of the solder flux.

EXAMPLE 3

For this example, use is made of the cleaning machine with reference to the single FIGURE.

The cleaning tank (2) is filled with the composition from Example 1. The cleaning bath is brought to a temperature of 69° C.

The rinsing tank (8) is filled with FORANE 365 HX solvent. The temperature of the rinsing tank (8) is 44° C.

The operating conditions used for this machine test are: an immersion time for the plate to be cleaned of 4 minutes in the tank (2) and a rinsing time of 2 minutes with ultrasound in the tank (8). The drying is carried out in the cold zone (6) for 3 minutes.

Under these conditions, the solder flux removal rates were greater than those usually obtained with FORANE® 141b MGX and no visible attack of the cleaned materials was observed.

The invention claimed is:

1. Composition comprising from 15 to 25% by weight of fluorinated base, from 50 to 70% by weight of secondary butanol, and from 15 to 25% by weight of DMSO, the sum of the percentages by weight of the constituents being equal to 100.

2. Composition according to claim 1, characterized in that the fluorinated base comprises one or more fluorinated compounds having a surface tension of less than 30 mN/m at 25° C. and a zero ozone degradation potential (ODP).

3. Composition according to claim 2, characterized in that the fluorinated compound is chosen from the group consisting hydrofluorocarbons (HFCs) hydrofluoro ethers (HFEs) and mixtures thereof.

4. Composition according to claim 1, characterized in that the fluorinated base also contains trans-1,2-dichloroethylene.

5. Composition according to claim 3, characterized in that the HFC is chosen from 1,1,1,3,3-pentafluorobutane (HFC 365 mfc), 1,1,1,2,3,4,4,5,5,5-decafluoropentane (HFC 4310 mee), 1,1,1,2-tetrafluoroethane (HFC 134 a), pentafluoroethane (HFC 125), 1,1,1-trifluoroethane (HFC 143 a), difluoromethane (HFC 32), 1,1-difluoroethane (HFC 152 a), 1-fluoroethane (HFC 161), 1,1,1,2,3,3,3-heptafluoropropane (HFC 227 ea), 1,1,1,3,3,pentafluoropropane (HFC 245 fa), octafluoropropane (HFC 218), (perfluorobutyl)ethylene ($C_4H_9CH=CH_2$), 1,1,2,2,3,4,5-heptafluoro-cyclopentane ($C_5H_3F_7$), perfluorohexylethylene ($C_6F_{13}CHCH_2$), tridecafluorohexane ($C_6F_{13}H$), perfluoro(methylmorpholine) (PF 5052) or mixtures thereof.

6. Composition according to claim 3, characterized in that the fluorinated base comprises a mixture of HFC 365 mfc and HFC 4310 mee and, optionally, HFC 227 ea.

7. Composition according to claim 3, characterized in that the HFE is chosen from methylheptafluoropropyl ether ($C_3F_7OCH_3$), methylnonafluorobutyl ether ($C_4F_9OCH_3$), ethylnonafluorobutyl ether ($C_4F_9OC_2H_5$), perfluoropyran ($C_5F_{10}O$) or mixtures thereof.

8. Method for defluxing electronic boards comprising a cleaning step, characterized in that the cleaning step is carried out with a composition according to claim 1.

9. Method of claim 8 comprising a first cleaning step and a second rinsing step, characterized in that the cleaning step is carried out with a composition according to claim 1, in a cleaning tank (2) and the rinsing step is carried out with a pure fluorinated base in a rinsing tank (8).

* * * * *